(12) United States Patent
Kim

(10) Patent No.: US 6,447,688 B2
(45) Date of Patent: Sep. 10, 2002

(54) METHOD FOR FABRICATING A STENCIL MASK

(75) Inventor: Cheol Kyun Kim, Seoul (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 09/822,460

(22) Filed: Apr. 2, 2001

(30) Foreign Application Priority Data

Apr. 3, 2000 (KR) ........................................ 2000/17356

(51) Int. Cl.$^7$ ................................................ H01L 21/00
(52) U.S. Cl. ............................ 216/12; 216/2; 216/45; 216/56; 438/734; 438/740; 438/744
(58) Field of Search ................................ 216/2, 12, 45, 216/56, 79, 99; 438/700, 719, 724, 740, 744, 745, 734, 735, 753, 757

(56) References Cited

U.S. PATENT DOCUMENTS 5,972,794 A * 10/1999 Katakura ................. 438/734 X
6,150,280 A * 11/2000 Yamashita ................. 438/719
6,204,182 B1 * 3/2001 Truninger et al. ...... 438/724 X

* cited by examiner

*Primary Examiner*—William A. Powell
(74) *Attorney, Agent, or Firm*—Pillsbury Winthrop LLP

(57) ABSTRACT

Disclosed is a novel method for fabricating a stencil mask comprising the formation of an absorber pattern, including an alignment key or target, on the topside of an SOI wafer having a transparent buried insulating layer. The formation of the absorber pattern is followed by the formation of an alignment window from the backside of the SOI wafer using the insulating layer as a lens. The alignment window allows the alignment between the absorber pattern and the frame pattern to be verified, using light passing through the window lens and illuminating the alignment key, before initiating the frame etch, thereby improving the quality and/or throughput of the stencil mask manufacturing process.

4 Claims, 5 Drawing Sheets

METHOD FOR FABRICATING A STENCIL MASK

BACKGROUND OF THE INVENTION

1. Field of the Invention

The present invention relates to a method for fabricating a stencil mask and, more particularly, to a method for fabricating a stencil mask which can improve alignment accuracy of front and rear patterns.

2. Description of the Related Art

As the degree of integration of a semiconductor device increases, it is necessary to develop patterns having fine line widths. The smallest critical dimension that can be achieved with a particular system is a function of the light source used in the exposure process. Exceptionally fine patterns require the use of a light source having an extremely short wavelength.

For example, although G-line and I-line deep-UV light sources have been used recently in conventional exposure processes, a light source having a shorter wavelength such as electron beam, ion beam and X-ray is necessary to achieve even finer critical dimensions. Non-optical lithography processes using an electron beam, ion beam, or X-ray as the light source for exposing a photoresist layer provide superior resolution when compared to conventional optical lithography processes relying on G-line or I-line light sources. Thus, the non-optical lithography processes make it possible to form patterns having critical dimension smaller than those that can be obtained using one of the conventional optical lithography processes.

Although non-optical lithography processes had generally been used in manufacturing exposure masks, more recently these processes have been used in manufacturing non-memory devices such as logic devices and ASIC devices.

In non-optical lithography processes, a typical exposure mask, that is, an exposure mask having a Cr pattern provided on a quartz substrate, has not been used. Because electron beams, ion beams, and X-ray sources have short wavelengths of tenths of Angstroms to hundreds of Angstroms, they cannot be transmitted effectively through a typical exposure mask.

Accordingly, on/off type stencil masks have been used as exposure masks in non-optical lithography processes. The stencil mask is a general term for exposure masks used in non-optical lithography processes with electron beam, ion beam, or X-ray sources and includes cell projection masks.

The stencil mask consists of a frame acting as supporting means, a membrane formed over the frame for reducing the stress due to exposure to the light source and maintaining balance, and a pattern formed over the membrane for absorbing or scattering a portion of the projected light source directed onto the stencil mask.

In fabricating stencil masks, it has been conventional to use silicon on insulator (SOI) wafers. As is generally known, a SOI wafer has a structure wherein a buried oxide is sandwiched between a silicon substrate and a silicon film.

The prior art method of fabricating a stencil mask will now be described with reference to FIGS. 1A to 1F.

Referring to FIG. 1A, an SOI wafer 10 having a buried oxide film 2 and a silicon film 3 sequentially formed on a silicon substrate 1 is prepared.

Referring to FIG. 1B, a silicon oxide film 11 is then formed on the surface of the SOI wafer 10. A resist film is coated on the silicon oxide film 11 on the front surface of the SOI wafer 10, exposed, and developed to form a first resist pattern 12 that exposes a portion of the silicon oxide film 11.

Referring to FIG. 1C, the exposed portion of the silicon oxide film 11 is etched using the first resist pattern 12 as an etching mask to form a silicon oxide film pattern. The first resist pattern 12 is then removed and silicon film 3 is etched using the silicon oxide film pattern as an etching mask to form an absorber 3a and an alignment key 3b. The remaining portion of silicon dioxide film 11 is then removed from the wafer. The alignment key 3b is then used in patterning the rear, or backside, surface of the SOI wafer 10.

Referring to FIG. 1D, in order to prevent the absorber 3a from being damaged when patterning the rear surface of the SOI wafer, a silicon nitride film 13 is then deposited over the entire surface of the wafer. A resist film is coated on the silicon nitride film 13 on the rear surface of the SOI wafer, exposed, and developed to form a second resist pattern 14 that exposes a portion of the silicon nitride film on the rear surface of the SOI wafer. During the exposure of the resist film, the SOI wafer is aligned using the alignment key 3b.

Referring to FIG. 1E, the silicon nitride film 13 formed on the rear surface of the SOI wafer is etched to a desired shape using the second resist pattern 14 as an etching mask. Silicon substrate 1 is then etched using the buried oxide 2 as an etching stop layer to form a frame 1a.

Referring to FIG. 1F, the second resist pattern 14 and the silicon nitride film are removed. After that, the exposed part of the buried oxide 2 is then typically removed with a wet etch process to complete the on/off type stencil mask 20.

However, this prior art method for fabricating stencil masks is deficient in several respects.

The rear surface patterning process applied to the rear surface of the SOI wafer 10, that is, the formation of the second resist pattern 14, is performed using the alignment key 3b formed on the front surface of the SOI wafer 10. The frame is then formed by etching the silicon layer 1 using the second resist pattern 14. However, it is impossible to check the alignment state after forming the second resist pattern. As a result, in instances in which the second resist pattern is misaligned relative to the first pattern, the frame produced after completion of the etching process is similarly misaligned. Particularly, where the frame misalignment blocks any portion of the aperture intended for transmitting through the stencil mask, the resulting stencil mask is defective.

The alignment state of the second resist pattern can be checked by another alignment apparatus at the rear surface of the structure shown in FIG. 1D. However, due to the cost of the apparatus and the valuable processing time required to check the alignment state of the second resist pattern in this manner, it is difficult to justify using the alignment apparatus regularly in a manufacturing environment.

SUMMARY OF THE INVENTION

Therefore, it is an object of the present invention to provide a method for fabricating a stencil mask that will provide improved alignment accuracy between the front and the rear patterns.

To accomplish this object, there is provided a method for fabricating a stencil mask comprising the steps of: preparing a SOI wafer having a transparent insulating film and a silicon film sequentially formed on a silicon substrate; forming an absorber pattern, including an alignment key, on the insulating film by patterning the silicon film, forming a first silicon nitride film on the resultant entire surface; forming a first resist pattern that exposes desired portions of a first silicon nitride film under the alignment key on a first silicon nitride film of the rear surface of the silicon substrate; forming an alignment window on the part of the silicon substrate under the alignment key by etching the first silicon nitride film and the silicon substrate using the first resist pattern as an etching mask; removing the first resist pattern, forming a second silicon nitride film on the inner wall of the alignment window; forming a second resist pattern restricting a frame forming area on the first and the second silicon nitride films under the silicon substrate by checking the alignment state of the alignment key through the alignment window; forming a frame by etching the first silicon nitride film and silicon substrate using a second resist pattern as an etching mask; removing the second resist pattern and the first and the second silicon nitride films; and removing the exposed part of the insulating film.

BRIEF DESCRIPTION OF THE DRAWINGS

The objects and features of the invention may be understood with reference to the following detailed description of an illustrative embodiment of the invention, taken together with the accompanying drawings in which.

DETAILED DESCRIPTION OF THE INVENTION

Now, referring to FIGS. 2A to 2F, a method for fabricating a stencil mask according to an embodiment of the present invention will be described in detail.

Figure 1A:
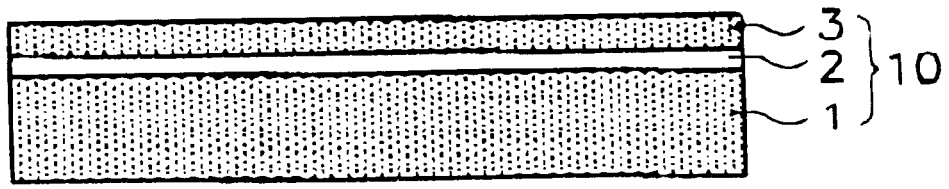
FIGS. 1A to 1F are sectional views of the construction of a stencil mask according to the prior art method.
Figure 1B:
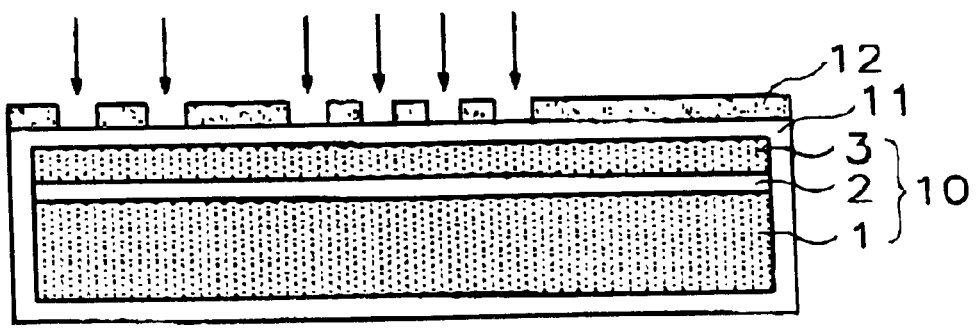
Figure 1C:
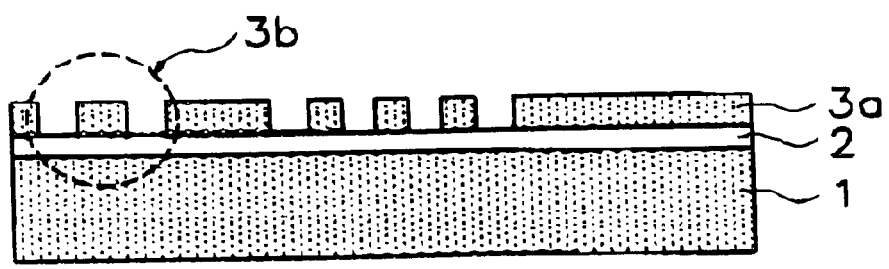
Figure 1D:
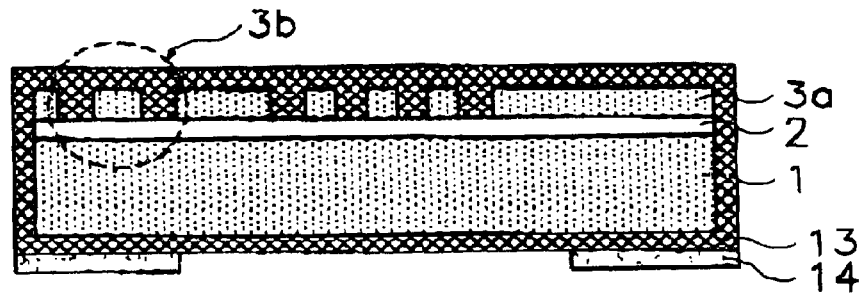
Figure 1E:
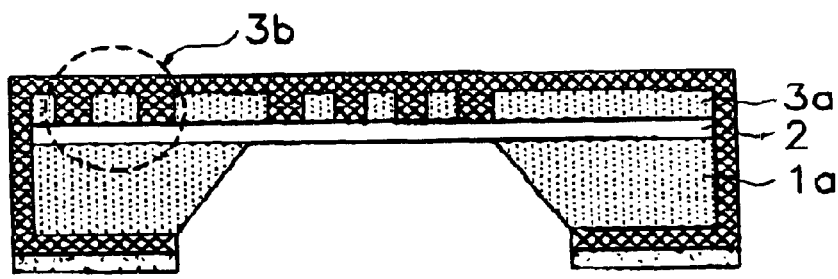
Figure 1F:
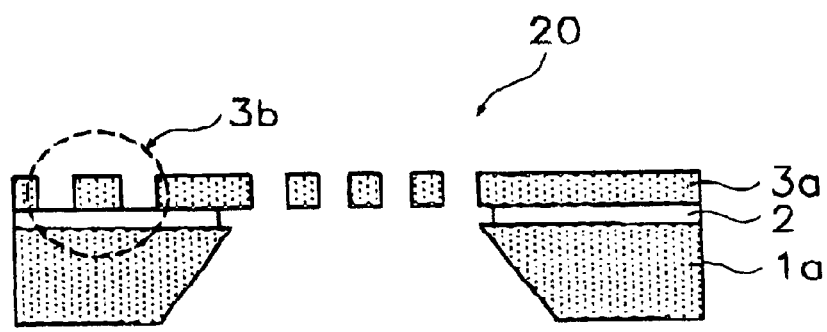
Figure 2A:
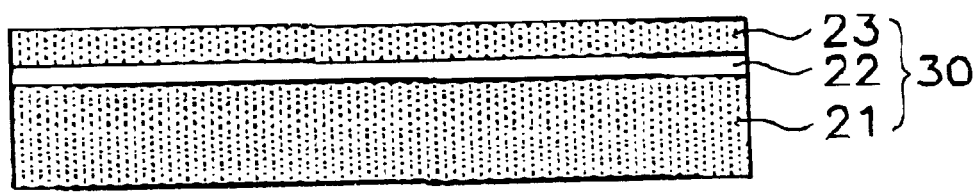
FIGS. 2A to 2F are sectional views of the construction of a stencil mask according to an embodiment of the present invention.

Referring to FIG. 2A, an SOI wafer 30 is prepared by sequentially forming a buried oxide film 22 and a silicon film 23 on a silicon substrate 21, with the buried oxide film 22 being optically transparent. Although an oxide film is preferred, other insulating films that can transmit a sufficient portion of light projected from an optical microscope may be used as an alternative to the buried oxide film 22. The insulating film is preferably formed from silicon oxide, silicon nitride, silicon oxynitride, or multi-layer structures comprising a combination of two or more layers of silicon oxide, silicon nitride or silicon oxynitride.

Figure 2B:
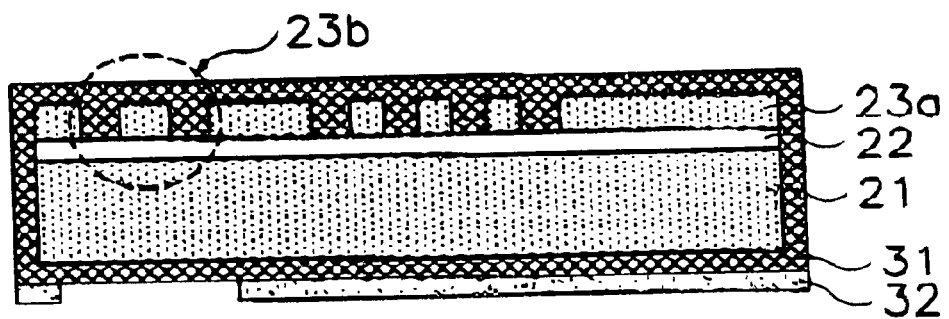

Referring to FIG. 2B, the silicon film is then patterned and etched using generally the same process as described above with regard to conventional stencil mask production, resulting in the formation of an absorber pattern 23a that includes an alignment key 23b made of silicon. A first silicon nitride film 31 is then on all of the wafer surfaces. A resist film is then formed on the rear surface of the wafer, exposed using alignment key 23b, and developed to form a first resist pattern 32.

Figure 2C:
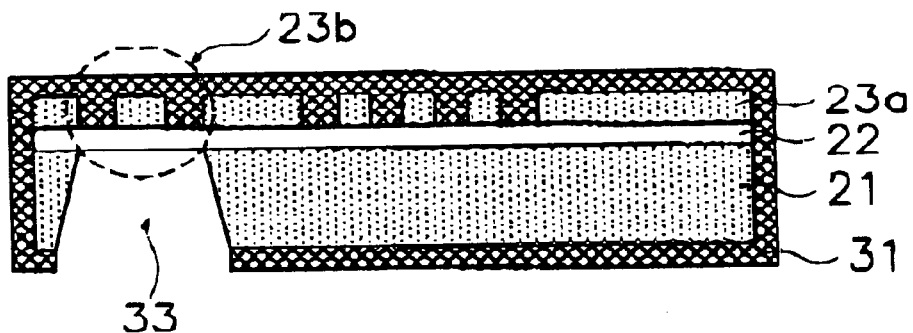

Referring to FIG. 2C, the exposed part of the first silicon nitride film 31 is then etched from the rear of the wafer using the first resist pattern 32 as an etching mask. The first resist pattern 32 is then removed and the exposed part of the silicon substrate 21 is etched using the buried oxide film 22 as an etching stop layer to form an alignment window 33 on the silicon substrate 21 under the alignment key 23b.

Figure 2D:
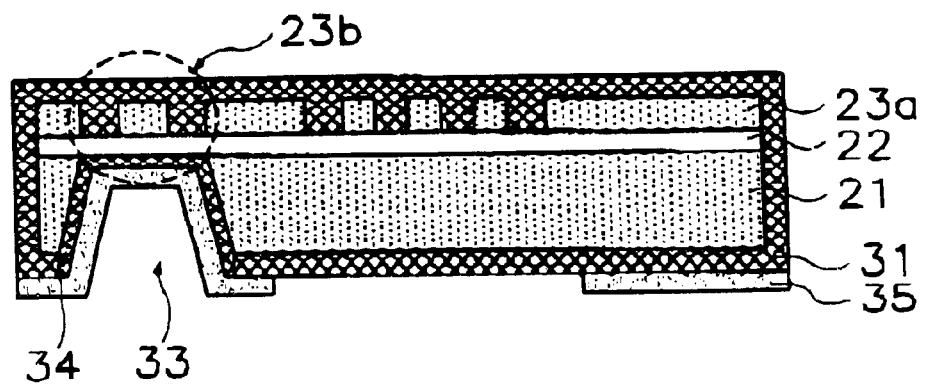

Referring to FIG. 2D, a second silicon nitride film 34 is deposited over the inner wall of the alignment window 33 to the thickness of 200~500 Å by using a conventional lift-off process. Thereafter, a resist film is formed on the first and second silicon nitride films 31 and 34 on the backside of silicon substrate 21. A second resist pattern restricting the frame forming area 35 is then formed by exposing and developing the resist film using the alignment key 23b.

Figure 2E:
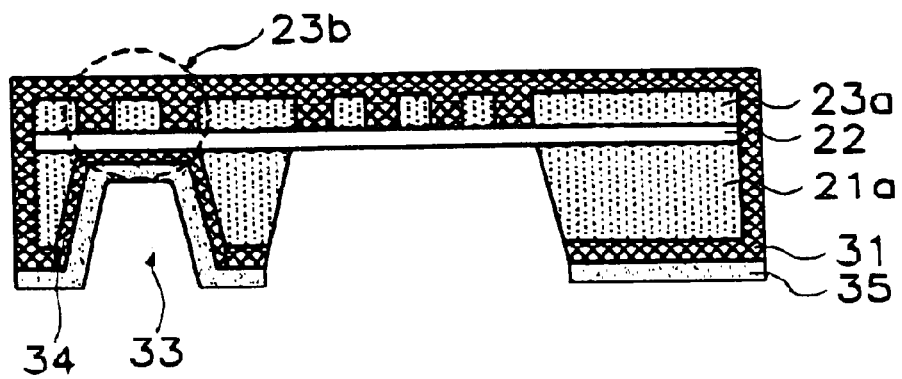

Referring to FIG. 2E, the first silicon nitride film 31 and the silicon substrate 21 are etched using the second resist pattern 35 as an etching mask to form a frame 21a.

Figure 2F:
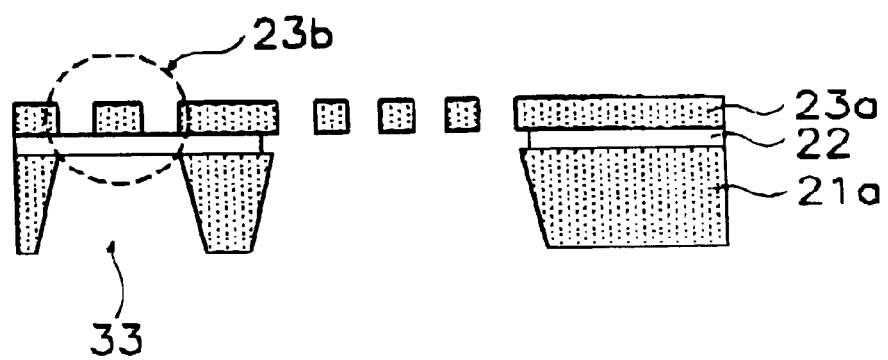

Referring to FIG. 2F, the second resist pattern 35 and the first and the second silicon nitride films 31 and 34 are removed from the wafer. The exposed portions of the buried oxide film are then etched, preferably using a wet etch process, to complete the formation of the on/off type stencil mask 40.

In accordance with the present invention, the alignment state of the second resist pattern 35 may be checked using an optical microscope. That is because the second resist pattern 35 has an alignment window and the buried oxide film is transparent, thereby allowing the alignment between the resist pattern and the alignment key 23b to be checked using light transmitted through the alignment window 33 from a source such as an optical microscope. Accordingly, the alignment of the second resist pattern 35 can be verified to ensure proper alignment, thereby preventing formation of a misaligned frame.

For example, when it is determined that the second resist pattern is correctly aligned, a frame is then formed by an etching process using the second resist pattern. However, when it is determined that the second resist pattern is misaligned, it can be removed and reworked to form another second resist pattern that incorporates alignment adjustments to achieve a satisfactory degree of alignment. Thus, the frame etch process is not initiate until the second resist pattern has been verified as properly aligned. Therefore, in accordance with the present invention, improved alignment accuracy between the front and the rear patterns can be obtained without sacrificing processing time or using expensive special apparatus.

As described above, the present invention can easily be utilized to check for and correct misalignment between the front and rear mask patterns by utilizing the transparency of the buried oxide film to form an alignment window for transmitting light from under the alignment key. Accordingly, improved alignment accuracy between the front and the rear patterns can be obtained, resulting in improved yield and reliability.

While the invention has been illustrated and described with respect to a preferred embodiment thereof, it will be understood by those skilled in the art that various changes in form and details may be incorporated without departing from the spirit and the scope of the invention as defined by the following claims.

What is claimed is:

1. A method for fabricating a stencil mask comprising the steps of:

providing a SOI wafer, the SOI wafer comprising a silicon substrate having a top surface and a bottom surface, a transparent insulating film formed on the silicon substrate top surface, and a silicon film formed on the transparent insulating films;

forming an absorber pattern, the absorber pattern including an alignment key, on the insulating film by patterning and etching the silicon film;

forming a first silicon nitride film on the SOI wafer, the nitride film covering the bottom surface of the silicon substrate and forming a backside surface;

forming a first resist pattern on the backside surface, first resist pattern exposing a portion of the first silicon nitride film arranged below the alignment key;

etching the first silicon nitride film and the silicon substrate using the first resist pattern as an etching mask to form an alignment window below the alignment key, the alignment window having a sidewall and a lens portion;

removing the first resist pattern;

forming a second silicon nitride film on the sidewall and lens portion of the alignment window to form a second backside surface;

forming a second resist pattern on the second backside surface, the second resist pattern being aligned with the absorber pattern, by ascertaining a degree of alignment between the second resist pattern and the alignment key using light transmitted through the alignment window;

forming a frame by etching the first silicon nitride film and the silicon substrate using the second resist pattern as an etching mask; and completing the stencil mask by removing the second resist pattern, removing the second silicon nitride film, and removing the first silicon nitride film.

2. A method according to claim 1, wherein the transparent insulating film comprises one or more insulating materials selected from the group consisting of silicon oxide, silicon nitride, and silicon oxynitride.

3. A method according to claim 1, wherein the transparent insulating film comprises a stacked structure comprising at least two insulating materials.

4. A method according to claim 3, wherein the two insulating materials are silicon oxide and silicon nitride, or silicon oxide and silicon oxynitride.

* * * * *